US007486508B2

(12) United States Patent
Liang

(10) Patent No.: US 7,486,508 B2
(45) Date of Patent: Feb. 3, 2009

(54) COMPUTER CASING STRUCTURE

(75) Inventor: Chien-Kuo Liang, Chung-Ho (TW)

(73) Assignee: Ablecom Computer, Inc., San Jose, CA (US)

( * ) Notice: Subject to any disclaimer, the term of this patent is extended or adjusted under 35 U.S.C. 154(b) by 57 days.

(21) Appl. No.: 11/640,247

(22) Filed: Dec. 18, 2006

(65) Prior Publication Data
US 2008/0144272 A1 Jun. 19, 2008

(51) Int. Cl.
- H05K 5/00 (2006.01)
- H05K 7/00 (2006.01)
- H05K 7/20 (2006.01)
- G06F 1/16 (2006.01)
- G06F 1/20 (2006.01)
- A47B 81/00 (2006.01)
- A47B 97/00 (2006.01)

(52) U.S. Cl. ............... 361/683; 361/687; 312/223.2
(58) Field of Classification Search ........... 361/683, 361/687; 174/15.1, 16.1; 312/223.2, 223.3
See application file for complete search history.

(56) References Cited

U.S. PATENT DOCUMENTS

| 5,822,184 | A * | 10/1998 | Rabinovitz | 361/685 |
| 6,404,624 | B1 * | 6/2002 | Jeong | 361/683 |
| 6,724,620 | B1 * | 4/2004 | Arbogast et al. | 361/685 |
| 7,075,787 | B2 * | 7/2006 | Chen | 361/687 |
| 2005/0280786 | A1 * | 12/2005 | Moiroux et al. | 353/119 |

* cited by examiner

Primary Examiner—Jayprakash N Gandhi
Assistant Examiner—Anthony M Haughton
(74) Attorney, Agent, or Firm—Troxell Law Office PLLC

(57) ABSTRACT

A computer casing structure is composed of a chassis, which is provided with a front panel on which is mounted with a lower long through-hole and an upper long through-hole; a metallic shield, which is punched with a plurality of through-holes and is locked and positioned into the lower long through-hole; a CD-ROM module, which is positioned at a rear side of the upper long through-hole; and a main board, a front edge of which is provided with a plurality of I/O connection ports, and which is fixed in the chassis, with the I/O connection ports being corresponding to the through-holes of the metallic shield. By mounting the CD-ROM module, a hard disk drive module, and I/O connectors on the same front panel and installing a data transmission port on a rear panel, convenience in operation is developed, and an effect of ventilation and heat dissipation is improved.

8 Claims, 6 Drawing Sheets

COMPUTER CASING STRUCTURE

BACKGROUND OF THE INVENTION a) Field of the Invention

The present invention relates to a computer casing structure, and more particularly to a computer casing structure wherein a CD-ROM module, a hard disk drive module, and I/O connectors are all mounted on a same front panel, as well as a data transmission port is constructed at an insertion hole of a rear panel, so as to develop convenience in operation.

b) Description of the Prior Art

A U.S. Pat. No. 6,850,408 B1 discloses a main board which is mounted with at least more than one I/O connector including at least one or more than one data transmission port, and a chassis which includes a front panel providing access to the I/O connectors, such that shields of the I/O connectors can be positioned on the access of the front panel.

As a function of an industrial computer is getting more and more versatile, a quantity of I/O connectors assembled on the shield of finite area is limited, they are not able to provide a utilization of multiple kinds of data transmission ports any more, and especially a certain degree of heat dissipation effect is lack on the front panel.

SUMMARY OF THE INVENTION

The primary object of present invention is to provide a computer casing structure, wherein a CD-ROM module, a hard disk drive module, and I/O connectors are all mounted on a same front panel, as well as a data transmission port is constructed on a rear panel, so as to develop convenience in operation.

Another object of the present invention is to provide a computer casing structure, wherein a rear panel is provided with an insertion hole, and two sides of the insertion hole are provided with connection holes for screwing with a LAN (Local Area Network) port, a COM port, or a USB port, such that the computer casing can be added with multiple kinds of data transmission ports for use.

Still another object of the present invention is to provide a computer casing structure, wherein a surface at a periphery of a lower long through-hole is provided with through-holes of heat dissipation, so as to increase a cooling function.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
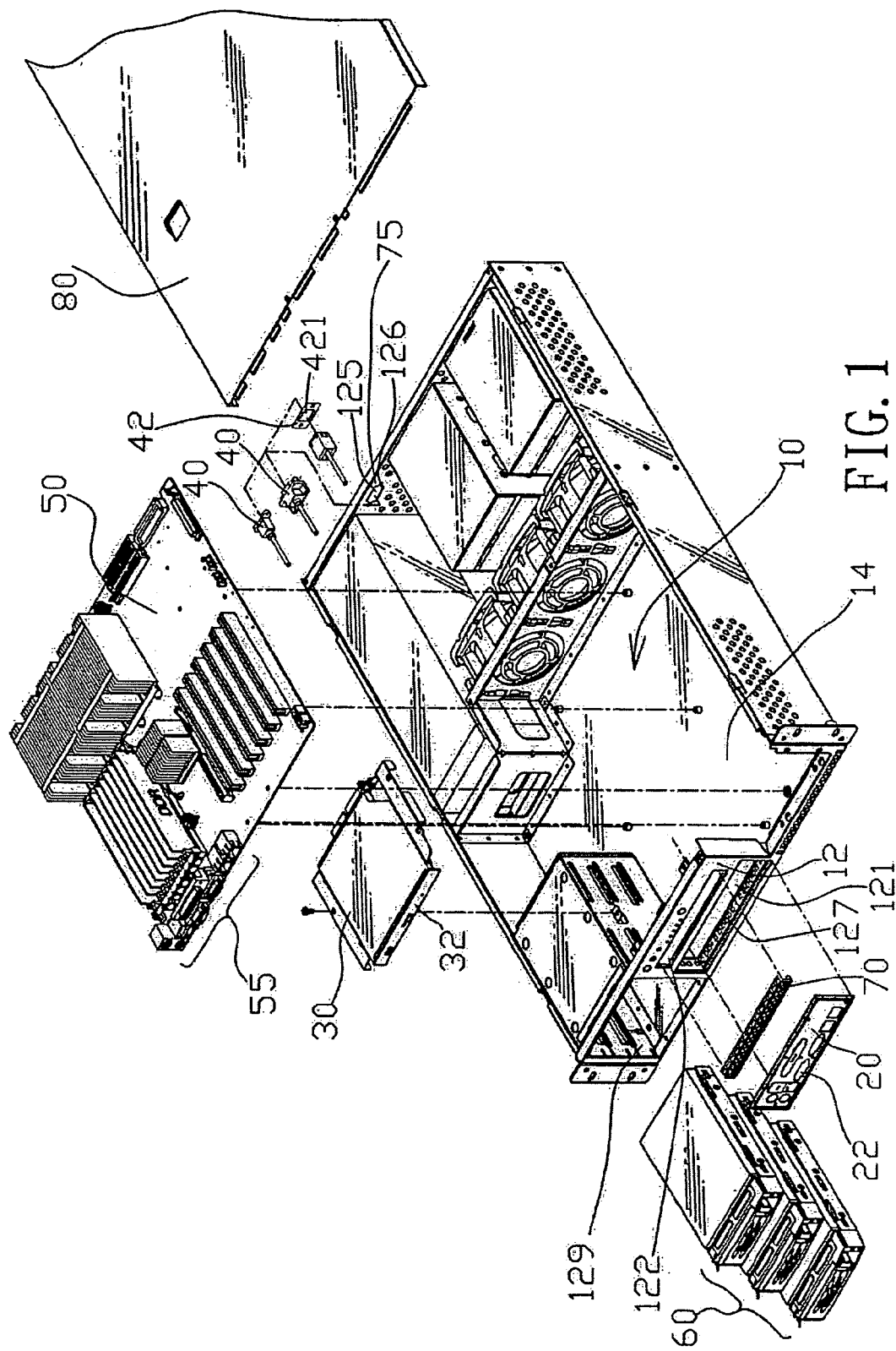
FIG. 1 shows a perspective view of components according to the present invention.

Referring to FIGS. 1 to 4, the present invention is to provide a computer casing structure including a chassis 10 which is provided with a vertical front panel 12, with a surface of the front panel 12 being installed respectively with a lower long through-hole 121 and an upper long through-hole 122; a metallic shield 20, which is punched with a plurality of through-holes 22 and is locked and positioned into the lower long through-hole 121; and a CD-ROM module 30, which is positioned at a rear side of the upper long through-hole 122, and an extensible disk cover 32 of which is corresponding to the upper long through-hole 122. A rectangular left chamber 129 is located on the front panel 12 and at a left side of the lower long through-hole 121, and a set of hard disk drive module 60 is inserted and positioned into the left chamber 129. A front edge of a main board 50 is mounted with a plurality of I/O connection ports 55, the main board 50 is fixed in the chassis 10, and the I/O connection ports 55 are corresponding to the through-holes 22 of the metallic shield 20. An insertion hole 125 is located on a rear panel 75 of the chassis 10, and a data transmission port 40 can be connected with and positioned into the insertion hole 125.

Figure 2:
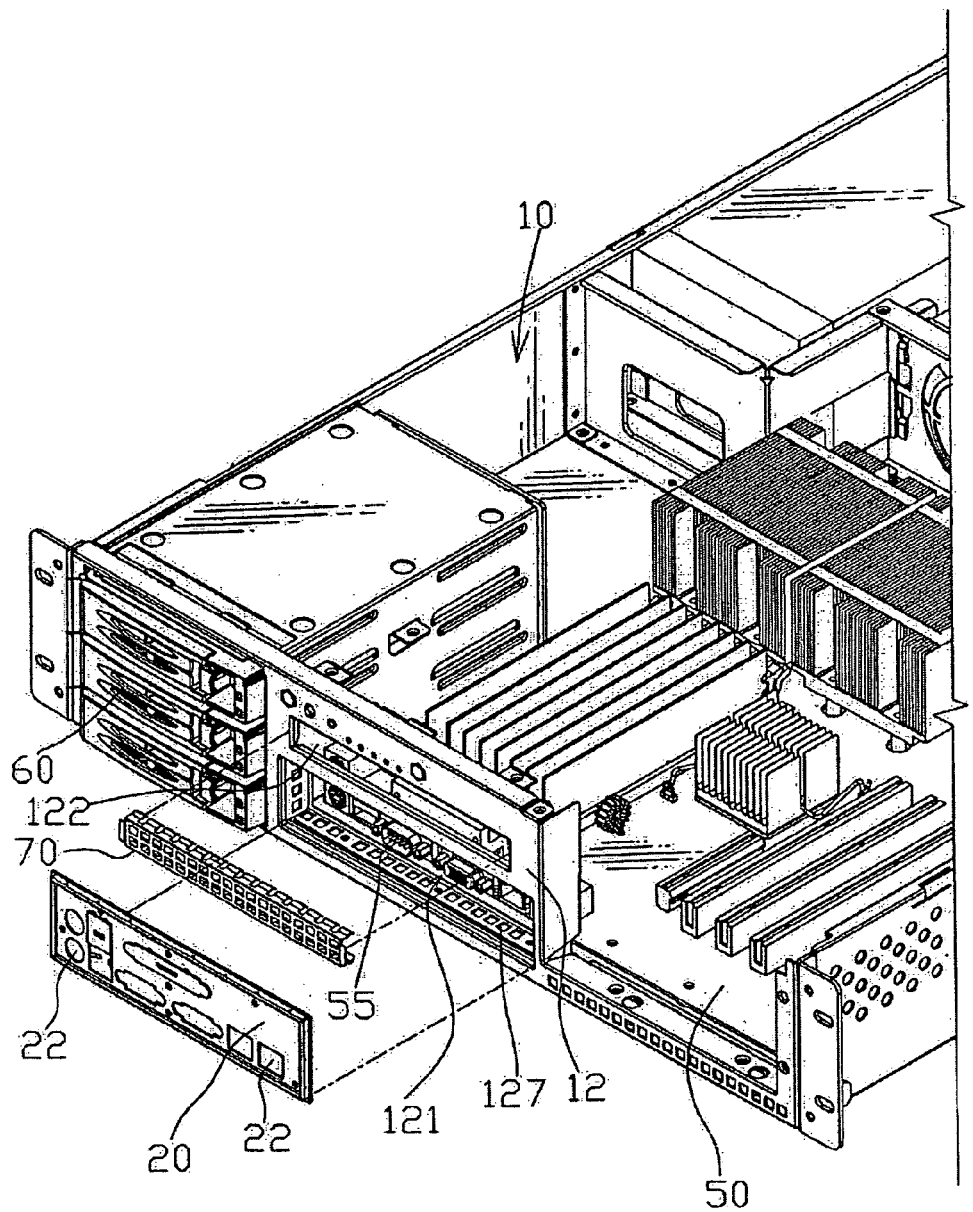
FIG. 2 shows a local exploded view of components without being assembled on a chassis, according to the present invention.
Figure 3:
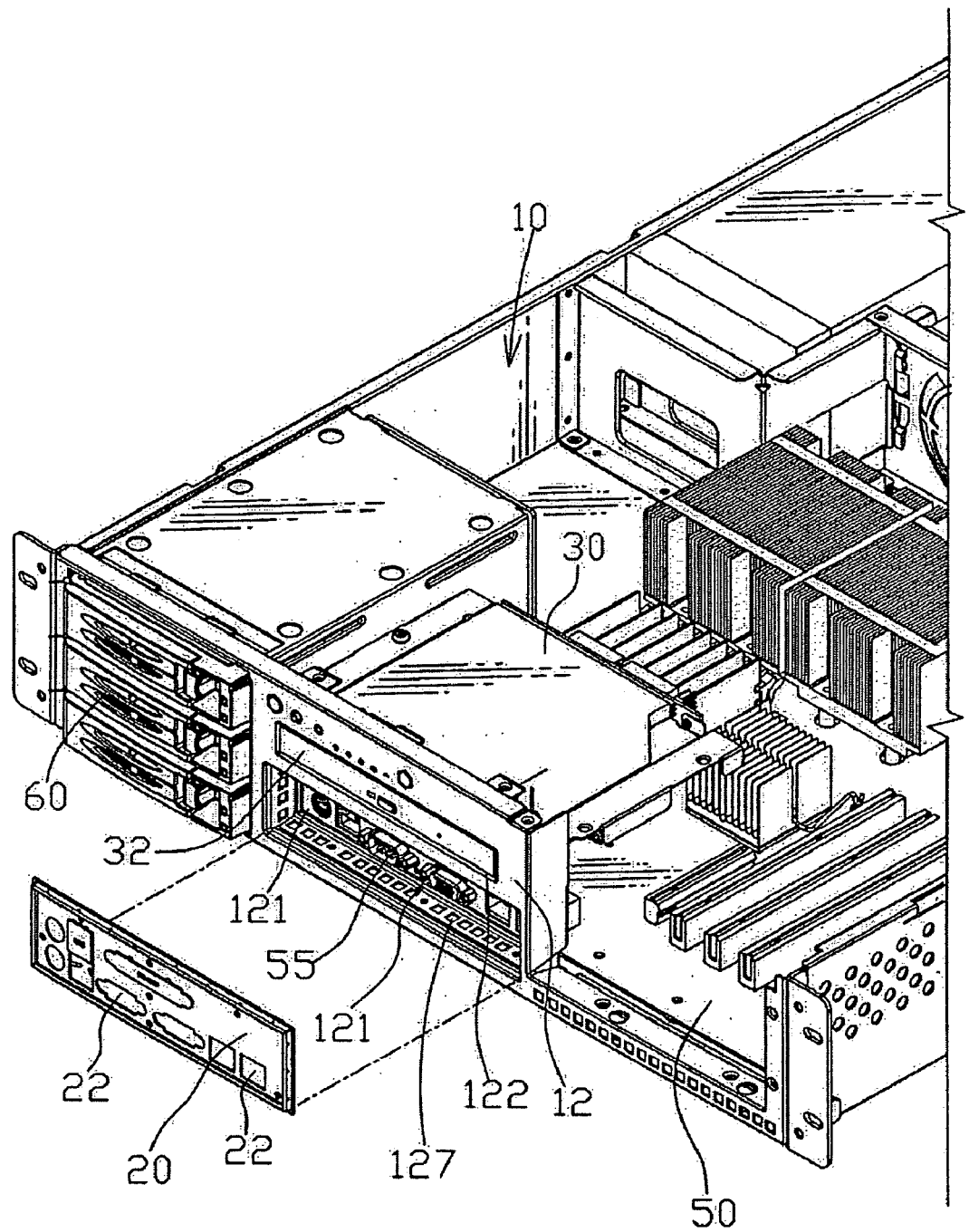
FIG. 3 shows another local exploded view of components without being assembled on a chassis, according to the present invention.

Referring to FIGS. 1 to 3, the data transmission port 40 can be optionally selected as one of the following components: a USB port, a LAN port, or a COM port.

Referring to FIG. 1, two sides of the insertion hole 125 are provided respectively with connection holes 126 for screwing and fixing the data transmission port 40.

Figure 6:
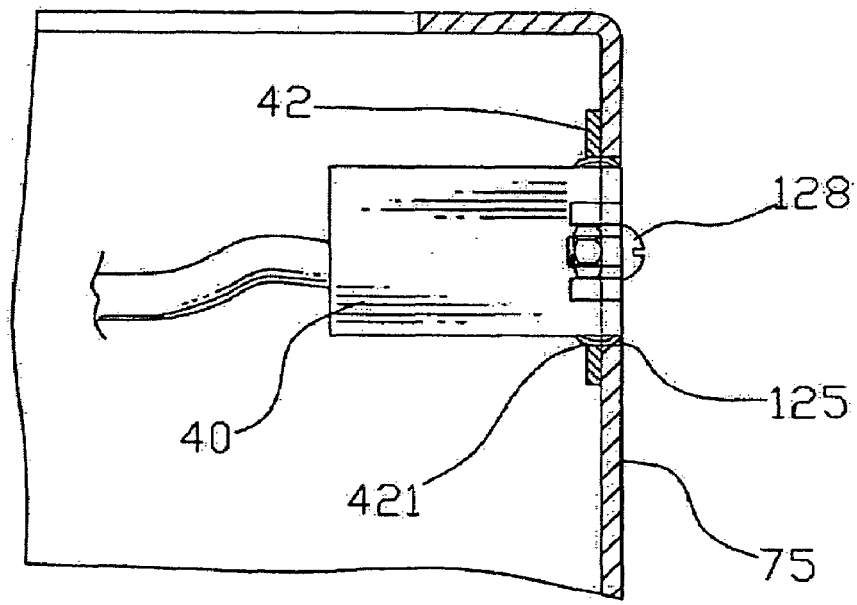
FIG. 6 shows another sectional view of an insertion hole being connected with another data transmission port, according to the present invention.

Referring to FIG. 6, if the data transmission port 40 is a LAN port, then an adapter plate 42 is screwed at a rear wall of the insertion hole 125, wherein a center of the adapter plate 42 is provided with a hole 421, such that the data transmission port 40 can be transfixed and flexibly positioned into the hole 421.

Figure 4:
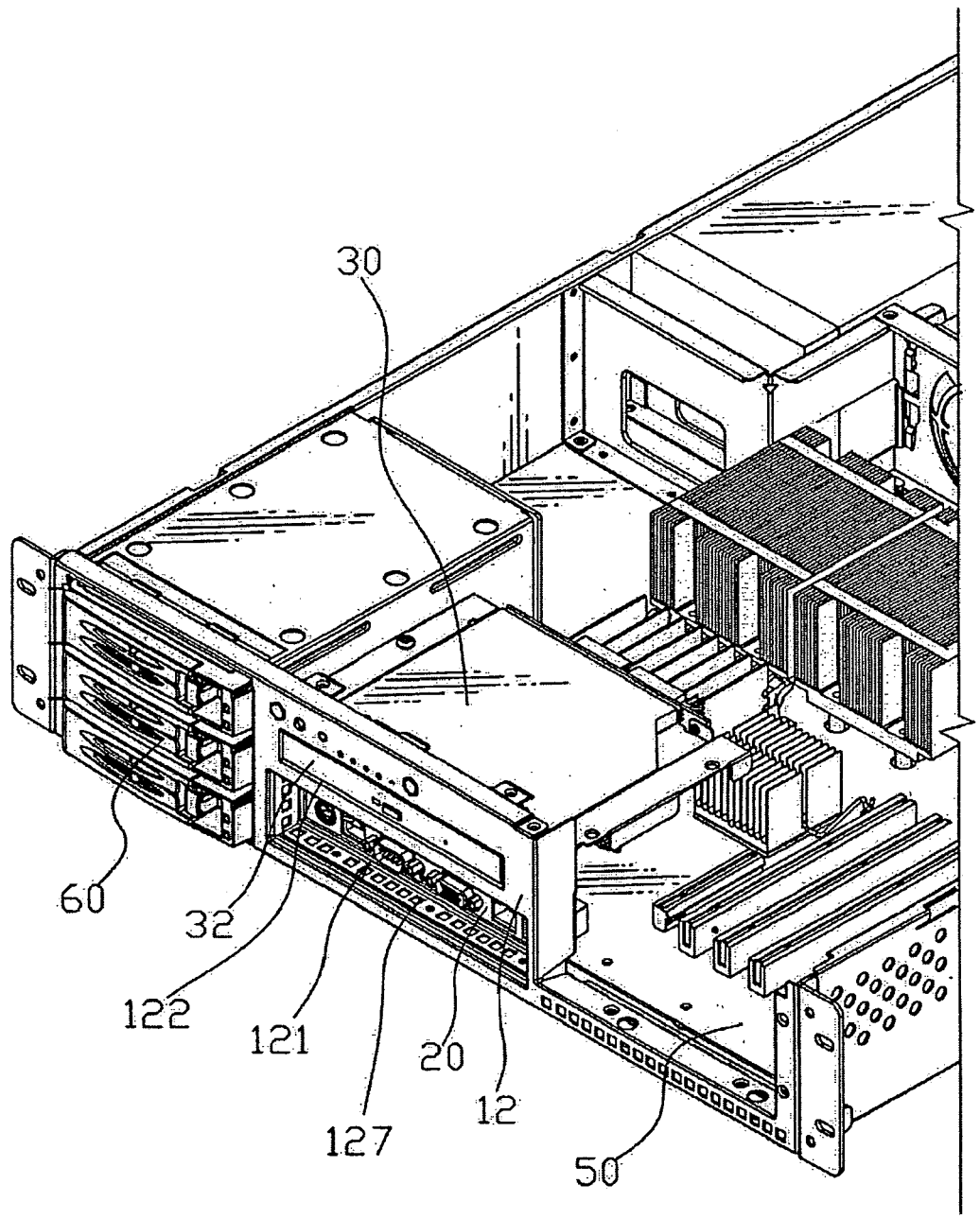
FIG. 4 shows a perspective view according to the present invention.

Referring to FIG. 4, a plurality of through-holes 127 is located on a surface at a periphery of the lower long through-hole 121 to enhance ventilation and heat dissipation.

Referring to FIG. 2, when the CD-ROM module 30 is not installed in the chassis 10, a U-shape cover 70 can be covered into the upper long through-hole 122, Referring to FIG. 1, a top of the chassis 10 is covered with an upper cover 80.

Referring to FIG. 1, a rear side of the front panel 12 is formed with a holding space 14 for emplacing and fixing the main board 50.

Referring to FIG. 1, a front panel 12 on a chassis 10 of the present invention is provided with a left chamber 129 for emplacing at least more than one hard disk drive module 60 which can be pulled or pushed horizontally into the left chamber 129 by hands. A front end of a main board 50 is welded with a plurality of I/O connection ports 55 to serve as connection sockets of all kinds of data transmissions. The main board 50 is screwed into a holding space 14, a lower long through-hole 121 is locked and fixed into a metallic shield 20 which is provided with a plurality of through-holes 22, and the plural I/O connection ports 55 at the front end of the main board 50 are corresponding to the plural through-holes 22 of the metallic shield 20 respectively.

Figure 5:
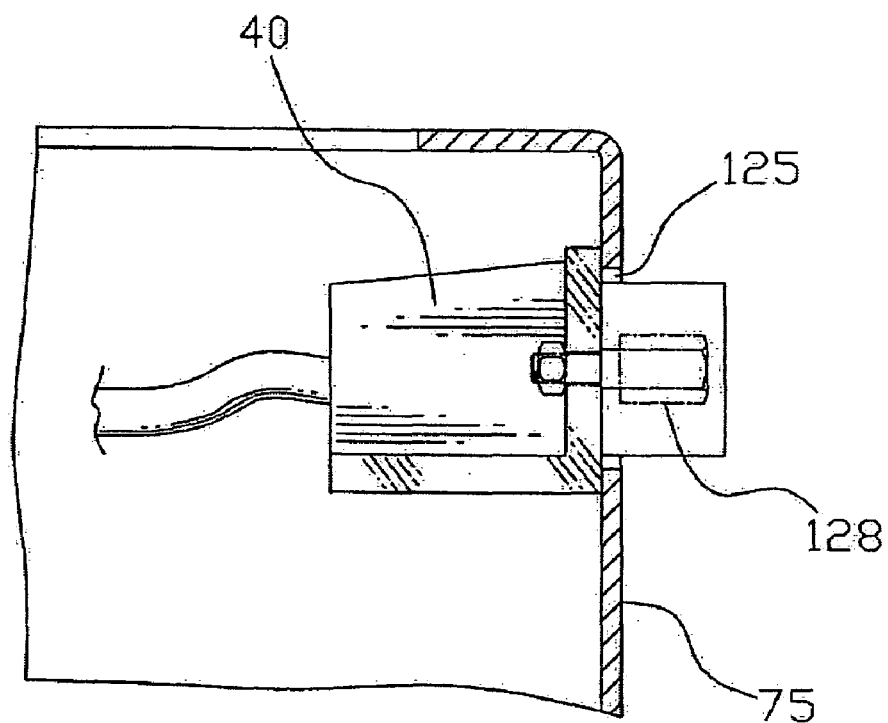
FIG. 5 shows a sectional view of an insertion hole being connected with a data transmission port, according to the present invention.
Figure 7:
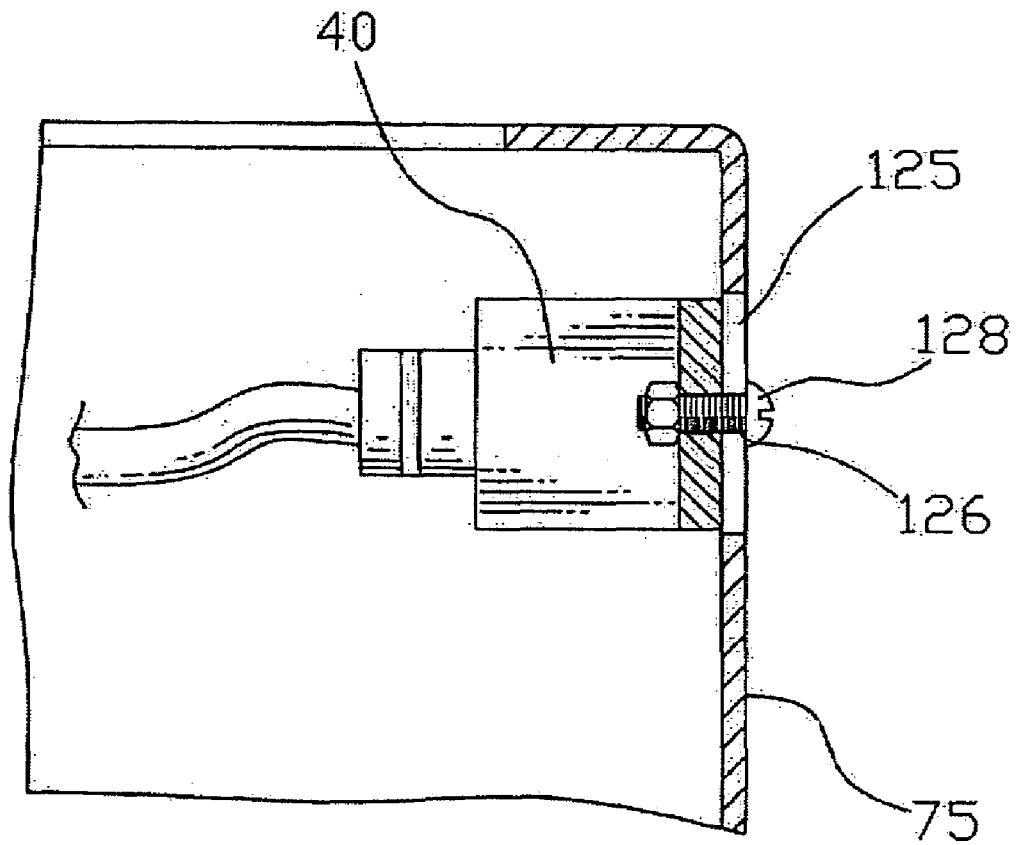
FIG. 7 shows a third sectional view of an insertion hole being connected with a third data transmission port, according to the present invention.

A CD-ROM module 30 is mounted above the main board 50, with an extensible disk cover 32 being exactly corresponding to an upper long through-hole 122. A data transmission port 40 including a USB port, a LAN port, or a COM port, is fixed on a wall at a rear side of an insertion hole 125 with a bolt 128 (as shown in FIGS. 5 to 7), such that at least one data transmission port 40 can be added under a structure of the standard I/O connection ports 55 of the present invention, thereby improving a function of use.

Referring to FIG. 2, when the CD-ROM module 30 is removed and not used, a U-shape cover 70 can be locked into the upper long through-hole 122 to cover the upper long through-hole 122. Due to an ingenious arrangement and connection of the front panel 12 with the hard disk drive module 60, the main board 50, the CD-ROM module 30, and the data transmission port 40, operation ends for a manual operation of the CD-ROM module 30 and the hard disk drive module 60 are all located on the front panel 12; therefore, convenience in operating the hard disk drive module 60 and the CD-ROM module 30 is increased. In particular, a rear panel 75 is added with the data transmission port 40, which further increases a data transmission function. Moreover, as the I/O connection ports 55, the CD-ROM module 30, and the hard disk drive module 60 are all installed on a same interface, that is, on the vertical front panel 12, the manual operation will be very quick and convenient.

In addition, as shown in FIG. 4, design of the plural through-holes 127 is to increase ventilation and heat dissipation. When higher temperature is produced by the I/O connection ports 55 and the main board 50, the heat dissipation can be assisted by the design of the plural through-holes 127.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A computer casing structure, comprising:
   a chassis, which is provided with a vertical front panel, with a surface of the front panel being installed respectively with a lower long through-hole and an upper long through-hole;
   a metallic shield, which is punched with a plurality of through-holes, and is locked and positioned into the lower long through-hole; and
   a CD-ROM module, which is positioned at a rear side of the upper long through-hole, with an extensible disk cover being corresponding to the upper long through-hole;
   wherein a rectangular left chamber is located on the front panel and at a left side of the lower long through-hole, a set of hard disk drive module is inserted and positioned into the left chamber, a front edge of a main board is provided with a plurality of I/O connection ports, the main board is fixed in the chassis, and the I/O connection ports are corresponding to the through-holes of the metallic shield, wherein a plurality of through-holes is located on an inset surface surrounding a periphery of the lower long through-hole to enhance ventilation and heat dissipation.

2. The computer casing structure according to claim 1, wherein a rear panel of the chassis is provided with an insertion hole, such that a data transmission port is connected with and positioned into the insertion hole.

3. The computer casing structure according to claim 2, wherein the data transmission port is optionally selected as one of the following components: a USB port, a LAN port, or a COM port.

4. The computer casing structure according to claim 2, wherein two sides of the insertion hole are provided respectively with connection holes for screwing and fixing the data transmission ports.

5. The computer casing structure according to claim 3, wherein when the data transmission port is the LAN port, an adapter plate, a center of which is provided with a hole, is screwed at a rear wall of the insertion hole, such that the data transmission port is transfixed and flexibly positioned into the hole.

6. The computer casing structure according to claim 1, wherein when the CD-ROM module is not installed in the chassis, a U-shape cover is covered into the upper long through-hole.

7. The computer casing structure according to claim 1, wherein an upper cover is covered on a top of the chassis.

8. The computer casing structure according to claim 1, wherein a rear side of the front panel is formed with a holding space for emplacing and fixing the main board.

* * * * *